(12) United States Patent
Kakihara et al.

(10) Patent No.: US 8,846,182 B2
(45) Date of Patent: Sep. 30, 2014

(54) PROCESS FOR PRODUCING TRANSPARENT CONDUCTIVE TRANSFER PLATE, TRANSPARENT CONDUCTIVE TRANSFER PLATE, PROCESS FOR PRODUCING TRANSPARENT CONDUCTIVE SUBSTRATE USING THE TRANSPARENT CONDUCTIVE TRANSFER PLATE, TRANSPARENT CONDUCTIVE SUBSTRATE, AND MOLDED PRODUCT USING THE TRANSPARENT CONDUCTIVE SUBSTRATE

(75) Inventors: Yasuo Kakihara, Hiroshima-ken (JP); Michihisa Kyoto, Hiroshima-ken (JP); Kyoichi Suzuki, Osaka (JP)

(73) Assignees: Toda Kogyo Corporation, Hiroshima-ken (JP); Fujicopian Co., Ltd., Osaka (JP)

( * ) Notice: Subject to any disclaimer, the term of this patent is extended or adjusted under 35 U.S.C. 154(b) by 826 days.

(21) Appl. No.: 13/001,496

(22) PCT Filed: Jun. 30, 2009

(86) PCT No.: PCT/JP2009/003025
§ 371 (c)(1),
(2), (4) Date: Feb. 28, 2011

(87) PCT Pub. No.: WO2010/001591
PCT Pub. Date: Jan. 7, 2010

(65) Prior Publication Data
US 2011/0143077 A1    Jun. 16, 2011

(30) Foreign Application Priority Data

Jul. 4, 2008    (JP) .................................. 2008-175560
Apr. 14, 2009    (JP) .................................... 2009-98298

(51) Int. Cl.
*B32B 3/00*    (2006.01)
*H01B 1/22*    (2006.01)
*H05K 9/00*    (2006.01)

(52) U.S. Cl.
CPC ................ *H05K 9/0096* (2013.01); *H01B 1/22* (2013.01); *Y10S 428/914* (2013.01)

USPC .............................. 428/172; 428/67; 428/914

(58) Field of Classification Search
CPC .......... H01B 5/14; B22B 5/16; B44C 1/1712; B44C 1/1733
USPC ............ 428/67, 172, 323, 328, 329, 330, 914
See application file for complete search history.

(56) References Cited

U.S. PATENT DOCUMENTS

2005/0214480 A1    9/2005    Garbar et al.
2009/0090462 A1    4/2009    Kato et al.

FOREIGN PATENT DOCUMENTS

| JP | 10-312715 | 11/1998 |
|----|-----------|---------|
| JP | 2001-155542 | 6/2001 |
| JP | 2005-530005 | 10/2005 |
| JP | 2006-012737 | 1/2006 |
| JP | 2006-12737 | 1/2006 |
| JP | 2007-227906 | 9/2007 |
| JP | 2007-234299 | 9/2007 |
| WO | WO 2006/129766 | 12/2006 |

OTHER PUBLICATIONS

International Search Report for PCT/JP2009/003025, mailed Oct. 20, 2009.

*Primary Examiner* — Catherine A Simone
(74) *Attorney, Agent, or Firm* — Nixon & Vanderhye P.C.

(57) ABSTRACT

A transparent conductive substrate capable of readily producing a transparent conductive substrate having a low resistance, a high transmittance and an excellent anti-moire property without using a special apparatus and can be applied to production of various extensive substrates by applying a dispersion solution of metal fine particles capable of forming a self-organized film on a support, drying the obtained coating layer and then subjecting the resulting dried material to heat treatment and/or chemical treatment particles on a support, drying the obtained coating layer and then reducing and precipitating the precursor of the metal fine particles, to previously form a transparent conductive film; and then bonding a substrate to the support to transfer the transparent conductive film onto the substrate and releasing the support from the transparent conductive film.

14 Claims, 3 Drawing Sheets

(a)

(b)

(c)

(I)

DISTANCE BETWEEN A AND B: 10 mm
RESISTANCE-MEASURING POINTS BEFORE MOLDING (II)

DISTANCE BETWEEN AA AND BB: 10 mm
RESISTANCE-MEASURING POINTS AFTER MOLDING

PROCESS FOR PRODUCING TRANSPARENT CONDUCTIVE TRANSFER PLATE, TRANSPARENT CONDUCTIVE TRANSFER PLATE, PROCESS FOR PRODUCING TRANSPARENT CONDUCTIVE SUBSTRATE USING THE TRANSPARENT CONDUCTIVE TRANSFER PLATE, TRANSPARENT CONDUCTIVE SUBSTRATE, AND MOLDED PRODUCT USING THE TRANSPARENT CONDUCTIVE SUBSTRATE

This application is the U.S. national phase of International Application No. PCT/JP2009/003025 filed 30 Jun. 2009, which designated the U.S. and claims priority to JP Application No. 2008-175560 filed 4 Jul. 2008; and JP Application No. 2009-098298 filed 14 Apr. 2009, the entire contents of each of which are hereby incorporated by reference.

TECHNICAL FIELD

The present invention relates to a transparent conductive substrate having a conductive random network structure exhibiting a low resistance, a high transmittance and an excellent anti-moire property, a process for producing the transparent conductive substrate, a transparent conductive transfer plate used for producing the transparent conductive substrate, and a process for producing the transparent conductive transfer plate. In addition, the present invention relates to a molded product obtained using the transparent conductive substrate which is in the form of an electromagnetic shielding material having a good visibility.

BACKGROUND ART

A transparent conductive substrate has been conventionally used as an antistatic film, a transparent electrode for touch panels or solar cells, an electromagnetic shielding material, etc. Among them, the electromagnetic shielding material has been intensively studied and researched in the various applications, and used for the purpose of suppressing emission of various kinds of electromagnetic waves from electronic equipments such as domestic appliances, cellular phones, personal computers and televisions. In particular, there is a fear that electromagnetic waves emitted from flat panel displays such as plasma displays and liquid crystal displays induce malfunction of devices and also have adverse influences on human bodies when exposed thereto for a long period of time. The methods for eliminating adverse influences from an electromagnetic wave generating source to suppress emission of the electromagnetic waves are generally classified into the following two types, i.e., (1) a method in which an electronic circuit is improved and designed so as to suppress emission of electromagnetic waves from the electromagnetic wave generating source; and (2) a method in which the electromagnetic wave generating source is covered with an electromagnetic shielding material. The above method (1) is more suitable as long as emission of electromagnetic waves is well suppressed, because no surplus members are needed therein. However, since the method (1) requires complicated procedures for identifying the source from which the electromagnetic waves are generated and further improving and designing the electronic circuit, there are many cases where use of the method (2) is more efficient and desirable rather than the method (1). Under this circumstance, studies have been made to develop a suitable electromagnetic shielding material.

As to the above method (2), there have been conventionally proposed several methods for producing a transparent conductive substrate that can be used in the applications of the electromagnetic shielding material. For example, there is known the method of forming a grid-like metal wiring. In this method, a metal foil such as a copper foil is formed into the grid-like metal wiring by photolithographic process (for example, refer to Patent Document 1). However, the photolithographic process requires not only complicated procedures but also a special apparatus which results in high costs. Also, there is disclosed the process in which Pd fine particles as a plating catalyst are applied onto a substrate and then the thus coated substrate is subjected to plating (for example, refer to Patent Document 2). However, in the above process, it is required to keep the plating solution under careful control which also results in complicated procedures and further causes the problem concerning environmental burden. In addition, there is disclosed the method for producing a transparent conductive substrate in which a printing ink prepared from metal fine particles is printed on a substrate by screen printing method and then heat-treated to form a grid-like metal wiring thereon (for example, refer to Patent Document 3). However, this method has such a problem that the metal wiring produced by such a printing method fails to have a sufficiently narrow width capable of conforming to still higher resolution of future displays.

Meanwhile, when the transparent conductive substrate having the grid-like metal wiring is applied to flat panel displays, etc., an "anti-moire" property of the transparent conductive substrate is important. The moire means spots appearing when points or lines that are distributed in a geometrically regular manner are overlapped, and more specifically is such a phenomenon that striped patterns are observed on displays. For this reason, it has been pointed out that a metal wiring having a random network structure, for example, is preferably used in place of the grid-like metal wiring. As a method of producing a transparent conductive substrate having the above random network-shaped metal wiring without using a photolithographic method or a printing method, there is disclosed the method in which a dispersion solution of metal fine particles is applied on a substrate and then dried to form a random network structure of the metal fine particles by utilizing a self-organizing phenomenon of the metal fine particles (for example, refer to Patent Document 4). This production method is considered to be more excellent in view of costs and reduction of environmental burden.

Also, as the above electromagnetic shielding material, there are mentioned metal foils such as aluminum foils, copper foils and iron foils, conductive cloths prepared by plating a polyester fiber with copper or nickel, metal shielding screens produced by arranging metal wires such as stainless steel wires and copper wires on a transparent substrate in a grid-like manner, transparent conductive substrates produced by printing a conductive paste containing a silver filler on a substrate in a grid-like manner, transparent conductive substrates produced by laminating ITO (oxide of indium and tin) on a substrate by vapor deposition, etc.

On the other hand, in recent years, the above electromagnetic shielding materials are required to have not only an electromagnetic shielding property but also a visibility for rendering objectives to be shielded viewable from outside. This is because there is a demand for subjecting electronic equipments to visual inspection to inspect a substrate or a wiring disposed therewithin from an outside of a housing thereof after being assembled.

To meet the above demand, there has been proposed the method in which a housing prepared from a transparent resin is attached with an optically transparent electromagnetic shielding material selected from the above-mentioned electromagnetic shielding materials to ensure a good visibility thereof.

Examples of the electromagnetic shielding material having an optical transparency include conductive cloths prepared by plating a polyester fiber with copper or nickel, metal shielding screens produced by arranging metal wires such as stainless steel wires and copper wires on a transparent substrate in a grid-like manner, transparent conductive substrates produced by printing a conductive paste containing a silver filler on a substrate in a grid-like manner, transparent conductive substrates produced by laminating ITO on a substrate by vapor deposition, etc.

In addition, when reduction of costs is intended, rather than the above method of attaching the electromagnetic shielding material to the housing of electronic equipments after completion of assembly thereof, it is apparently preferred from industrial viewpoints to use the method in which the transparent resin substrate as a raw material of the housing is first imparted with an electromagnetic shielding property, and then the resulting electromagnetic shielding transparent resin substrate is subjected to molding process to produce the housing.

However, in the case where the above electromagnetic shielding material is subjected to molding process in place of the transparent resin substrate as a raw material of the housing, or in the case where the electromagnetic shielding material is attached or laminated onto a molding transparent resin substrate and then the resulting composite or laminate is molded and formed into a shape of the housing, there tends to arise such a problem that bent corner portions of the housing suffer from defects which therefore results in difficulty in production of the housing.

More specifically, when using the metal shielding screen or the transparent conductive substrate produced by printing a conductive paste containing a silver filler on a substrate, the wirings formed by the metal wire or silver filler tend to be broken at the bent portions of the housing, so that it may be difficult to ensure a current flow through an entire portion of the housing. As a result, it is required to connect the respective current-flowing portions to ground when the housing is grounded, or to subject the housing to a secondary treatment to form a bridge between the current-flowing portions to ensure a current flow through an entire portion of the housing.

In addition, when using the transparent conductive substrate produced by applying ITO onto a substrate by vapor deposition, the resulting ITO thin film tends to suffer from cracks at bent portions thereof, thereby failing to ensure a current flow through an entire portion of the housing.

On the other hand, there is disclosed a transparent conductive film having a random network structure formed from metal fine particles (Patent Documents 5 and 6). It is expected that the transparent conductive film is used as an electromagnetic shielding material having an excellent visibility because of a high optical transparency and a high electrical conductivity thereof.

Patent Document 1: Japanese Patent Application Laid-open (KOKAI) No. 2001-217589
Patent Document 2: Japanese Patent Application Laid-open (KOKAI) No. 2005-203484
Patent Document 3: PCT Pamphlet WO 2005/115070
Patent Document 4: Japanese Patent Application Laid-open (KOKAI) No. 2006-32197
Patent Document 5: Japanese PCT Application Laid-Open (TOKUHYO) No. 2005-530005
Patent Document 6: Japanese Patent Application Laid-open (KOKAI) No. 2007-234299

DISCLOSURE OF THE INVENTION

Problem to be Solved by the Invention

Meanwhile, in the above method utilizing the self-organizing phenomenon, the metal fine particles are collected together upon dried to form a random network structure. However, in order to obtain a sufficiently low resistance, it is required to subsequently subject the random network structure to heat treatment or chemical treatment. The reason therefor is as follows. That is, although it is generally reported that metal fine particles undergo accelerated low-temperature sintering by reducing a particle size thereof, it is required to subject the metal fine particles to heat treatment or chemical treatment to remove therefrom an organic dispersant that is added to a dispersion solution of the metal fine particles for the purposes of preventing the metal fine particles from being unified together and keeping a good dispersibility thereof in the dispersion solution. In addition, since the organic solvent used in the dispersion solution of the metal fine particles is generally capable of well dissolving a resin therein, the substrate laminated with the transparent conductive film tends to be deteriorated during the treatment unless the substrate used has a high chemical resistance. Further, taking a good adhesion between the metal fine particles and the substrate into consideration, it is required to previously apply a heat-sensitive adhesive layer or a pressure-sensitive adhesive layer onto the substrate. However, when applying these layers, the substrate tends to suffer from change in surface properties thereof, thereby inhibiting the metal fine particles from being self-organized.

Thus, the method of producing the transparent conductive substrate by utilizing a self-organizing phenomenon of the metal fine particles is a method capable of readily producing the transparent conductive substrate having an excellent antimoire property as compared to the photolithographic method, plating method or printing method. However, the substrate usable in the method is limited to those having a heat resistance or a chemical resistance and further is required to maintain surface properties even after applying a heat-sensitive adhesive layer or a pressure-sensitive adhesive layer thereonto. Therefore, in the above method, there still remain various problems to be solved and improved.

Further, in recent years, there is a more and more increasing demand for a good visibility of the electromagnetic shielding material. Therefore, the electromagnetic shielding material having a sufficiently high optical transparency which is capable of meeting the above requirement is limited only to metal shielding screens, transparent conductive substrates produced by printing a conductive paste containing a silver filler onto a substrate in a grid-like manner, transparent conductive substrates produced by laminating ITO on a substrate by vapor deposition, etc.

However, there are present only limited substrates which can exhibit a sufficient durability against both of the organic solvent used for forming a transparent conductive film having an excellent transparency and conductivity and the heat and/or chemical treatments for improving a conductivity. Therefore, it may be difficult to obtain a transparent conductive substrate in which a transparent conductive film is laminated on a readily moldable inexpensive substrate. As a result, various problems still remain unsolved.

In addition, there are no conventional electromagnetic shielding materials or transparent conductive substrates which are capable of being readily molded into a housing, although they are sufficient in optical transparency and electromagnetic shielding property.

An object of the present invention is to provide a process for producing a transparent conductive substrate which is capable of readily producing the transparent conductive substrate having a low resistance, a high transmittance and an excellent anti-moire property without using a special apparatus and can be applied to production of various extensive substrates; a transparent conductive substrate; a process for producing a transparent conductive transfer plate used in the above process; and a transparent conductive transfer plate, as well as a transparent conductive substrate having a high durability.

Another object of the present invention is to provide a transparent conductive substrate which has a sufficiently high optical transparency and electromagnetic shielding property and can be readily subjected to molding process, as well as a transparent conductive molded product.

Means for Solving the Problem

That is, in accordance with the present invention, there is provided a process for producing a transparent conductive transfer plate, comprising the steps of:

applying a dispersion solution of metal fine particles capable of forming a self-organized film on a support having a heat resistance and/or a chemical resistance and then drying the obtained coating layer; and subjecting the resulting dried material to heat treatment and/or chemical treatment to form a transparent conductive film exhibiting a low resistance, a high transmittance and an excellent anti-moire property and having a conductive random network structure on the support (Invention 1).

Also, according to the present invention, there is provided a process for producing a transparent conductive transfer plate, comprising the steps of:

applying a solution of a metal salt as a precursor of metal fine particles capable of forming a self-organized film on a support having a heat resistance and/or a chemical resistance and then drying the obtained coating layer; and reducing and precipitating the precursor of the metal fine particles by heating, irradiation with an ultraviolet ray or a reducing gas to form a transparent conductive film exhibiting a low resistance, a high transmittance and an excellent anti-moire property and having a conductive random network structure on the support (Invention 2).

Also, according to the present invention, there is provided the process for producing a transparent conductive transfer plate as described in the above Invention 1 or 2, wherein prior to applying the dispersion solution of the metal fine particles or the solution of the metal salt on the support, the support is subjected to surface treatment (Invention 3).

In addition, according to the present invention, there is provided a transparent conductive transfer plate produced by the process for producing a transparent conductive transfer plate as described in any one of the above Inventions 1 to 3 (Invention 4).

In addition, there is provided a process for producing a transparent conductive substrate, comprising the steps of:

locating the transparent conductive transfer plate as described in the above invention 4 and a substrate such that the transparent conductive film formed on the transparent conductive transfer plate is opposite to one surface of the substrate each other;

subjecting the transparent conductive transfer plate and the substrate to compression-bonding or thermocompression-bonding to each other to transfer the transparent conductive film onto the substrate; and releasing the support from the transparent conductive transfer plate (Invention 5).

In addition, according to the present invention, there is provided a process for producing a transparent conductive substrate, comprising the steps of:

forming a heat-sensitive adhesive layer, a pressure-sensitive adhesive layer, a coupling agent layer or an organic gel layer on at least one of the surface of the transparent conductive transfer plate as described in the above Invention 4 on which the transparent conductive film is formed, and one surface of a substrate;

subjecting the transparent conductive transfer plate and the substrate to compression-bonding or thermocompression-bonding to each other to transfer the transparent conductive film onto the substrate; and releasing the support from the transparent conductive transfer plate (Invention 6).

Also, according to the present invention, there is provided a transparent conductive substrate produced by the process for producing a transparent conductive substrate as described in the above Invention 5 or 6 (Invention 7).

Also, according to the present invention, there is provided the transparent conductive substrate as described in the above Invention 7, wherein the transparent conductive film is embedded in either the substrate only, both the substrate and the heat-sensitive adhesive layer, both the substrate and the pressure-sensitive layer, both the substrate and the coupling agent layer or both the substrate and the organic gel layer, or not embedded in the substrate but embedded in any of the layers by itself such that the surface of the transparent conductive film is aligned with a surface of the substrate, the heat-sensitive adhesive layer, the pressure-sensitive adhesive layer, the coupling agent layer or the organic gel layer on the same plane (Invention 8).

Also, according to the present invention, there is provided the transparent conductive substrate as described in the above Invention 7, wherein the substrate is a thermoplastic resin substrate (Invention 9).

Also, according to the present invention, there is provided the transparent conductive substrate as described in the above Invention 9, wherein the metal fine particles are formed of at least one element selected from the group consisting of Au, Ag, Cu, Ni, Co, Fe, Cr, Zn, Al, Sn, Pd, Ti, Ta, W, Mo, In, Pt and Ru, or an alloy comprising at least two of the metal elements (Invention 10).

Also, according to the present invention, there is provided the transparent conductive substrate as described in the above Invention 9 or 10, wherein the heat-sensitive adhesive layer or the pressure-sensitive adhesive layer is a layer of a heat-sensitive adhesive or a pressure-sensitive adhesive which is formed of a thermoplastic resin (Invention 11).

Also, according to the present invention, there is provided the transparent conductive substrate as described in any one of the above Inventions 9 to 11, wherein the thermoplastic resin substrate is a resin substrate selected from the group consisting of an acrylic substrate, a polycarbonate substrate, a polypropylene substrate, a polyvinyl chloride substrate, an amorphous polyethylene terephthalate substrate, an ABS substrate, a polystyrene substrate and a laminated substrate of any two or more of these substrates (Invention 12).

In addition, there is provided a transparent conductive molded product produced by molding the transparent conductive substrate as described in any one of the above Inventions 9 to 12 (Invention 13).

Effect of the Invention

When using the process for producing a transparent conductive transfer plate according to the present invention, it is possible to readily produce a transparent conductive transfer plate in which a transparent conductive film exhibiting a low resistance, a high transmittance and an excellent anti-moire property and having a conductive random network structure is formed on a support, without using a special apparatus. In particular, when selectively using the support suitable for forming the transparent conductive film, it is possible to subject the film to sufficient heat treatment and/or chemical treatment, thereby enabling formation of the transparent conductive film exhibiting a low resistance, a high transmittance and an excellent anti-moire property.

Also, in the process for producing a transparent conductive substrate according to the present invention, the transparent conductive film formed on the transparent conductive transfer plate is transferred onto the substrate after production of the transparent conductive transfer plate. Therefore, the substrate is not limited to specific ones, so that it is possible to readily produce the transparent conductive substrate exhibiting a low resistance, a high transmittance and an excellent anti-moire property, without using a special apparatus. As a result, the transparent conductive substrate having an excellent performance can be readily produced by using extensive substrates.

In addition, in the transparent conductive substrate according to the present invention, the transparent conductive film is embedded in either the substrate only, both the substrate and the heat-sensitive adhesive layer, both the substrate and the pressure-sensitive layer, both the substrate and the coupling agent layer or both the substrate and the organic gel layer, or not embedded in the substrate but embedded in any of the layers by itself. Therefore, the transparent conductive film can maintain a strength of a fine random network structure thereof and therefore can exhibit an excellent durability.

Further, the transparent conductive substrate according to the present invention exhibits a sufficiently high optical transparency and can be readily subjected to molding process, and therefore can be readily molded to form a housing for electronic equipments which has an electromagnetic shielding property and a visibility.

Figure 1:
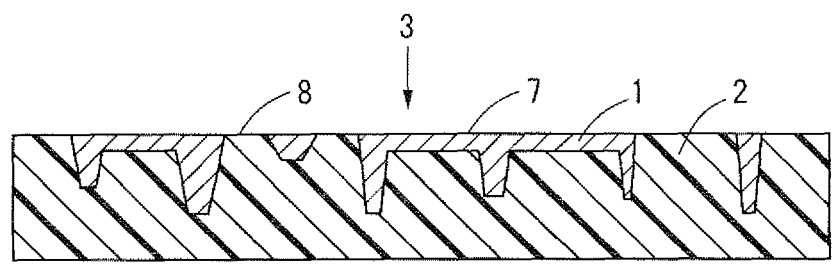
FIG. 1 is sectional views showing a relationship between a transparent conductive film of a transparent conductive substrate according to the present invention, and a substrate.
Figure 1:
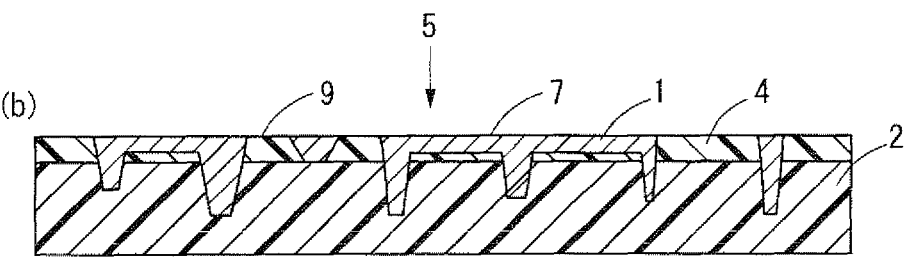
Figure 1:
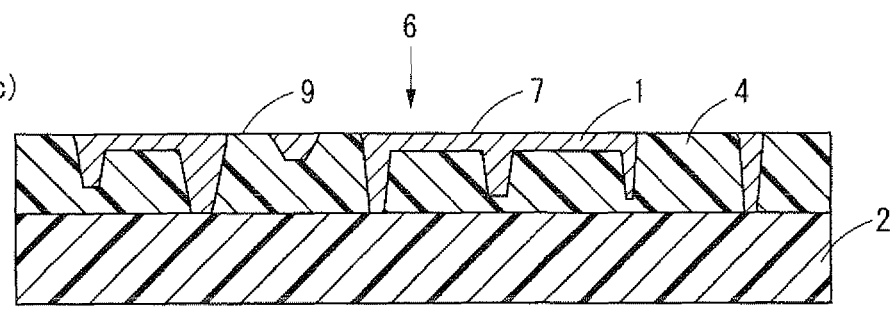
Figure 2:
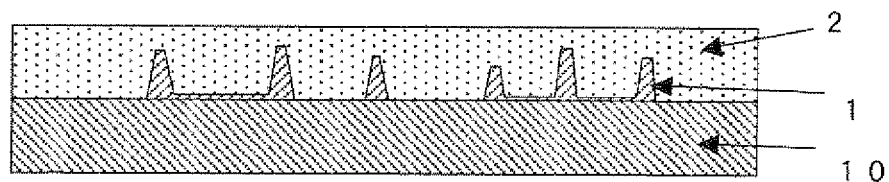
FIG. 2 is a sectional view showing a relationship between a substrate, a transparent conductive film and a support when a transparent conductive transfer plate is compression-bonded onto the substrate.

EXPLANATION OF REFERENCE NUMERALS 1, 11: transparent conductive film; 2: substrate; 3, 5, 6, 15: transparent conductive substrate; 4, 9, 13: heat-sensitive adhesive layer, pressure-sensitive adhesive layer, coupling agent layer or organic gel layer; 7: surface of transparent conductive film; 8: surface of substrate; 10, 12: support; 14: thermoplastic resin substrate; 16: vacuum molding machine

PREFERRED EMBODIMENT FOR CARRYING OUT THE INVENTION

The process for producing a transparent conductive substrate according to the present invention includes the step of laminating a transparent conductive film on a support to produce a transfer plate; and the step of transferring the transparent conductive film of the transfer plate onto a desired substrate to produce the transparent conductive substrate.

The "support" used in the present invention means a resin film, etc., which is used for production of a transfer plate and has a thickness of about 1 to about 200 µm. The "substrate" used in the present invention means a substrate to which any film material is transferred from the transfer plate, and includes a resin film, a resin plate, a glass plate or the like which is distinguished from the support used in the transfer plate and has a thickness ranging from 1 µm to 10 mm.

First, a dispersion solution of metal fine particles is applied on the support and then dried, and the resulting dried material is subjected to heat treatment and/or chemical treatment, or a solution of a precursor of the metal fine particles is applied on the support and then dried, and thereafter the precursor of the metal fine particles thus applied is reduced and precipitated by heating, irradiation with an ultraviolet ray or a reducing gas, to thereby produce a transfer plate in which a transparent conductive film exhibiting a low resistance, a high transmittance and an excellent anti-moire property to a sufficient extent is laminated on the support.

Thereafter, the transfer plate is laminated onto a desired substrate and subjected to heat treatment, pressure treatment or any other treatment method to transfer the transparent conductive film from the transfer plate to the desired substrate, and then the support of the transfer plate is released therefrom, thereby obtaining the transparent conductive substrate exhibiting a low resistance, a high transmittance and an excellent anti-moire property.

Upon transferring the transparent conductive film onto the desired substrate, a heat-sensitive adhesive layer, a pressure-sensitive adhesive layer, a coupling agent layer or an organic gel layer (hereinafter referred to merely as a "heat-sensitive adhesive layer or the like") may be interposed between the desired substrate and the transparent conductive film. The heat-sensitive adhesive layer, the pressure-sensitive adhesive layer, the coupling agent layer, the adhesive organic gel layer or the like is applied to a surface of the desired substrate and/or a surface of the transfer plate, and then the desired substrate and the transfer plate are laminated on each other, followed by subjecting the resulting laminate to heat treatment and pressure treatment or any of these treatment or to irradiation with an ultraviolet ray when using an ultraviolet-curable type heat-adhesive layer, to thereby transfer the transparent conductive film from the transfer plate onto the desired substrate. Thereafter, the support is released from the transfer plate, thereby obtaining the transparent conductive substrate in which the transparent conductive film exhibiting a low resistance, a high transmittance and an excellent anti-moire property is laminated on the substrate.

Meanwhile, in the present invention, the "heat-sensitive adhesive layer" means a layer which exhibits no adhesion force at an ordinary temperature but generates an adhesion force when heated, whereas the "pressure-sensitive adhesive layer" means a layer which exhibits an adhesion force even at an ordinary temperature.

FIG. 1 is a sectional view showing the relationship between the transparent conductive film and the substrate of the transparent conductive substrate according to the present invention. The above transparent conductive substrate may be in the form of any of a transparent conductive substrate 3 as shown in FIG. 1(a) in which the transparent conductive film 1 is completely embedded in the substrate 2 by means of a hot press, etc.; a transparent conductive substrate 5 as shown in FIG. 1(b) in which the transparent conductive film 1 is embedded in both of the heat-sensitive adhesive layer or the like 4 and the substrate 2 by means of a hot press, etc.; and a transparent conductive substrate 6 as shown in FIG. 1(c) in which the transparent conductive film 1 is embedded in the heat-sensitive adhesive layer or the like 4 by using the transparent conductive transfer plate described in Invention 4. In any of the transparent conductive substrates 3, 5 and 6, the transparent conductive film 1 is completely embedded in the substrate 2 or the heat-sensitive adhesive layer or the like 4 so that the surface 7 of the transparent conductive film 1 is aligned with the surface 8 of the substrate 2 or the surface 9 of the heat-sensitive adhesive layer or the like 4 on the same plane. As a result, the transparent conductive film 1 maintains a strength of a fine random network structure thereof and desirably exhibits an excellent durability.

As the dispersion solution of the metal fine particles or the solution of a precursor of the metal fine particles, there may be used any dispersion solutions of the metal fine particles or any solutions of the precursor of the metal fine particles as long as when the dispersion solution of the metal fine particles or the solution of the precursor of the metal fine particles is applied onto the support and then dried, it is possible to form a random network structure of the metal fine particles owing to a self-organizing phenomenon thereof, and further when the resulting laminated substrate is subjected to heat treatment and chemical treatment or any of these treatments or when the precursor of the metal fine particles is reduced or precipitated by heat or light or by any chemical method, it is possible to form a transparent conductive film which can exhibit a low resistance, a high transmittance and an excellent anti-moire property. For example, there may be used a dispersion solution of metal fine particles and a solution of a precursor of the metal fine particles which are produced by referring to Japanese Patent Application Laid-Open (KOKAI) Nos. 2007-234299 and 10-312715 and Japanese PCT Application Laid-Open (TOKUHYO) No. 2005-530005.

As the metal fine particles contained in the dispersion solution of the metal fine particles or the solution of the precursor of the metal fine particles, there may be used fine particles of metals such as Au, Ag, Cu, Ni, Co, Fe, Cr, Zn, Al, Sn, Pd, Ti, Ta, W, Mo, In, Pt and Ru, fine particles of alloys of the metals, and fine particles of oxides or sulfides of the metals, as well as carbon-containing carbon fine particles, so-called nanocarbon materials such as carbon nanotube, fullerene and carbon nanohorn, silicon-containing silicon fine particles, fine particles of silicon alloys of silicon and other metals, silicon oxide fine particles, silicon carbide fine particles and silicon nitride fine particles (in the present invention, these carbon and silicon materials are also involved in the scope of the metal fine particles). In view of attaining a high conductivity, among them, dispersion solutions of the metal fine particles containing at least one element selected from Au, Ag and Cu or solutions of precursors of the metal fine particles are preferably used. In addition, among these metal elements, in view of an oxidation resistance and economy, Ag is preferably used.

The support of the transfer plate is formed of a material that is excellent in heat resistance and chemical resistance. In the process for producing a transparent conductive transfer plate according to the present invention, the dispersion solution of the metal fine particles is applied onto the support and then dried, and thereafter the resulting dried material is subjected to heat treatment and chemical treatment or any of these treatments, or the solution of the precursor of the metal fine particles is applied onto the support and then dried, and thereafter the precursor of the metal fine particles applied is reduced and precipitated by heating, irradiation with an ultraviolet ray or a reducing gas, to thereby form a transparent conductive film exhibiting a low resistance, a high transmittance and an excellent anti-moire property to a sufficient extent on the support. Therefore, the material of the support must be capable of withstanding these procedures and treatments. If the support is formed of an inappropriate material and therefore the metal fine particles or the precursor of the metal fine particles cannot be subjected to sufficient heat treatment, chemical treatment, ultraviolet-irradiation treatment or reduction and precipitation treatment by a reducing gas, it is not possible to obtain the transparent conductive film exhibiting a low resistance, a high transmittance and an excellent anti-moire property to a sufficient extent. For example, when the dispersion solution of the metal fine particles or the solution of the precursor of the metal fine particles comprises an organic solvent, the support is required to have a solvent resistance. When the support onto which the dispersion solution of the metal fine particles or the solution of the precursor of the metal fine particles is applied and then dried is dipped in a hydrochloric acid aqueous solution, the support is required to have an acid resistance. In addition, when the support applied with the dispersion solution or the solution is subsequently subjected to heat treatment, the material of the support must be selected from those materials having not only an acid resistance but also a heat resistance. Specific examples of the material used for the support include glass, polyethylene terephthalate (PET), polyethylene naphthalate, polyamides, polyimides and polyphenylene sulfides. In view of a good workability upon transferring, the support is preferably formed of a flexible resin. The support may be used repeatedly. The thickness of the support used may be about 1 to about 200 μm, and is preferably in the range of 50 to 150 μm.

Upon forming the transparent conductive film and conducting the transferring procedure, the support of the transfer plate is preferably previously subjected to surface treatments to facilitate smooth transfer of the transparent conductive film without breaking thereof. As the surface treatments, there may be used the method of applying a so-called primer such as silicone-based polymers and fluorine-based polymers, the method of roughening the surface of the support by corona treatment or plasma treatment, and the method of washing the surface of the support with acid or alkali substances. The surface treatments may be carried out to such an extent that the self-organizing phenomenon of the metal fine particles or the precursor of the metal fine particles is adversely inhibited thereby. For example, if the support has a poor wettability with the coating solution, the surface of the support may be modified so as to improve its wettability. However, when the wettability of the support is enhanced excessively, the resulting conductive film tends to become too dense owing to the self-organizing phenomenon, resulting in deteriorated transparency of the film.

As the method of applying the dispersion solution of the metal fine particles or the solution of the precursor of the metal fine particles on the support, there may be employed so-called general coating methods used upon coating treatments on ordinary supports such as those methods using a spin coater, a bar coater, a die coater and a dipping coater as well as a spray coating method.

The temperature used in the heat treatment to be conducted after the dispersion solution of the metal fine particles is applied on the support and then dried, may vary depending upon the material of the support, and is preferably in the range of 100 to 300° C. and more preferably 100 to 200° C. in order to form a conductive film having a sufficiently low resistance.

As the chemical treatment to be conducted after the dispersion solution of the metal fine particles is applied on the support and then dried, there may be used the method of immersing the resulting dried material in an organic solvent and an inorganic or organic acid which have a property capable of removing a dispersant or a resin contained in the metal fine particles and an effect of accelerating sintering between the metal fine particles. By using the above method, it is possible to obtain a transparent conductive film exhibiting a low resistance, a high transmittance and an excellent anti-moire property. Examples of the suitable organic solvent include alcohols such as methanol, ethanol and isopropanol; and ketones such as acetone and methyl ethyl ketone. Examples of the suitable inorganic acid include hydrochloric acid and nitric acid. Examples of the suitable organic acid include formic acid and acetic acid.

The heat treatment and chemical treatment may be conducted singly or in combination thereof.

Upon reducing the precursor of the metal fine particles, there may be used the methods such as heating, irradiation with light such as ultraviolet ray and radiation, and a reducing gas, or by combination of these methods.

For the purpose of further functionalizing conductive portions of the transparent conductive film, fine particles of a metal, a metal oxide, a metal sulfide, etc., which have a catalytic property may be added thereto. Also, in order to prevent deterioration in weather resistance and chemical resistance and deterioration owing to oxidation reduction potential, the surface of the conductive portions of the transparent conductive film may be subjected to plating.

The properties of the transparent conductive film produced in the form of the transfer plate by the above method may vary depending upon the kind of support to which the film is applied and the treating method. However, the surface resistivity of the transparent conductive film is preferably in the range of not more than 100Ω/□, and the transmittance of the film is preferably in the range of not less than 60%. More preferably, the surface resistance is not more than 30Ω/□, and the transmittance is not less than 70%. In particular, in the case of the transparent conductive substrate (Invention 7) produced in Invention 5 or 6, the surface resistivity is preferably not more than 20Ω/□ and more preferably not more than 10Ω/□. When the surface resistivity is more than 100Ω/□, the transparent conductive film tends to be insufficient in electromagnetic shielding property. Whereas, when the transmittance is less than 60%, an imaging device using the transparent conductive film tends to require a stronger light source or tends to be deteriorated in resolution. The lower limit of the surface resistivity of the transparent conductive film is not particularly limited, and is usually about 0.01Ω/□.

The material of the substrate to which the transparent conductive film formed on the transfer plate is transferred may be selected from extensive materials according to the respective applications thereof. Examples of the material of the substrate include glass, polyethylene terephthalate (PET), amorphous polyethylene terephthalate (A-PET), polyethylene naphthalate, polyamides, polyimides, polyphenylene sulfide, polyethylene, polypropylene, polystyrene, polyvinyl chloride, polyvinylidene chloride, polycarbonates, acrylic resins, ABS, Si substrates and porous ceramics.

The resins corresponding to materials of the heat-sensitive adhesive layer, the pressure-sensitive adhesive layer, the coupling agent layer or the adhesive organic gel layer which may be applied onto the surface of the substrate to which the transparent conductive film is to be transferred, and/or the surface of the transfer plate upon transferring the transparent conductive film onto the desired substrate, are illustrated as follows.

As the material of the heat-sensitive adhesive layer, there may be used adhesives formed of various thermoplastic resins, and curing-type adhesives. Examples of the thermoplastic resins include at least one resin selected from the group consisting of polyvinyl chloride, polycarbonates, polymethyl methacrylate, polybutyl methacrylate, polyesters, polysulfones, polyvinyl butyral, polyvinyl acetal, polyphenylene oxide, polybutadiene, poly(N-vinyl carbazole), polyvinyl pyrrolidone, hydrocarbon resins, ketone resins, phenoxy resins, polyamides, chlorinated polypropylene, urea, cellulose, vinyl acetate, ABS resins, polyurethanes, phenol resins, melamine resins, unsaturated polyester resins, alkyd resins, epoxy resins, silicone resins and copolymers thereof, and mixtures of any two or more of these resins.

Examples of the heat-curable type heat-sensitive adhesives include epoxy resins such as bisphenol A-type epoxy resins, bisphenol F-type epoxy resins and novolak-type epoxy resins; diene-based resins such as polyisoprene, poly-1,2-butadiene, polyisobutene and polybutene; polyacrylic acid ester copolymers produced from ethyl acrylate, butyl acrylate, 2-ethylhexyl acrylate, t-butyl acrylate, etc.; polyester-based resins such as polyvinyl acetate and polyvinyl propionate; and polyolefin-based resins such as polyethylene, polypropylene, polystyrene and EVA.

As the ultraviolet-curing type heat-sensitive adhesives, there may be used extensive commercially available heat-sensitive adhesives such as, typically, acrylic resin-based adhesives.

As the material of the pressure-sensitive adhesive layer, there may be used various pressure-sensitive adhesives including acrylic pressure-sensitive adhesives. The pressure-sensitive adhesives may be produced by subjecting an acrylic copolymer obtained by copolymerizing a low-Tg monomer as a main monomer such as butyl acrylate, ethyl acrylate and 2-ethylhexyl acrylate with a functional group-containing monomer such as acrylic acid, methacrylic acid, hydroxyethyl methacrylate, hydroxyethyl acrylate, acrylamide and acrylonitrile to crosslinking reaction in the presence of a known crosslinking agent such as isocyanate-based, melamine-based and epoxy-based compounds.

The organic gel layer is formed of an organic gel. As the organic gel, there may be used those organic gels obtained by adding a high-molecular or low-molecular gelling agent to ionic liquids, acetonitrile, N,N-dimethyl formamide, propylene carbonate and γ-butyrolactone.

As the transfer method, there may be used the method in which after transferring the transparent conductive film by heating and/or application of pressure using a hot press, a heat-transferring device equipped with a roll laminator and a thermal head, the support of the transfer plate is released, the method in which after laminating the transfer plate on the desired substrate, the resulting laminate is irradiated with ultraviolet ray to cure the resin, and then the support of the transfer plate is released, etc.

Next, the transparent conductive substrate described in Invention 9 is explained. The transparent conductive substrate is basically produced by the process including the steps of producing the transfer plate by the process described in any of Inventions 1 to 3; laminating the transparent conductive transfer plate on the substrate, if required, after forming the heat-sensitive adhesive layer or the like on at least one of the surface of transparent conductive transfer plate where the transparent conductive film is provided, and one surface of the substrate, to transfer the transparent conductive film onto the substrate; and thereafter releasing the support of the transfer plate.

Figure 3:
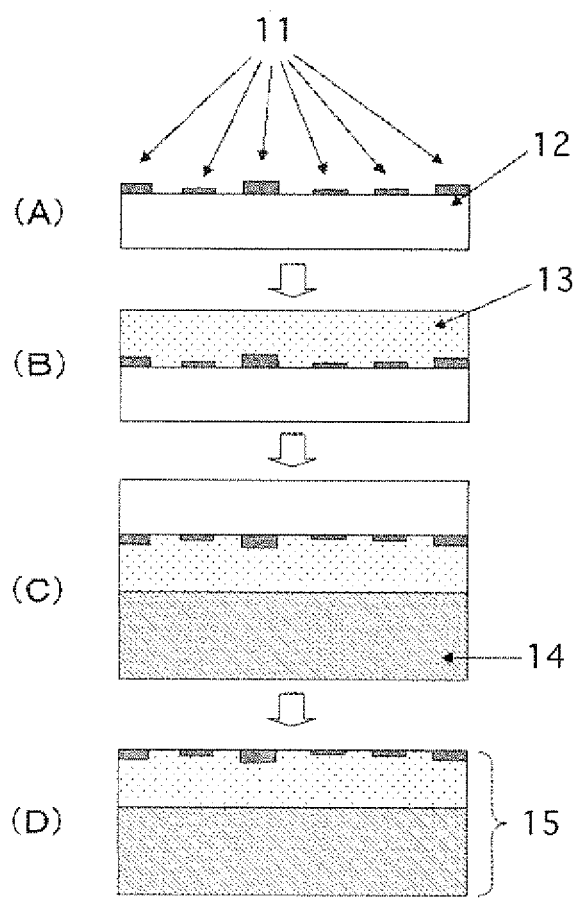
FIG. 3 is a flow diagram showing production of a transparent conductive substrate according to the present invention.
Figure 4:
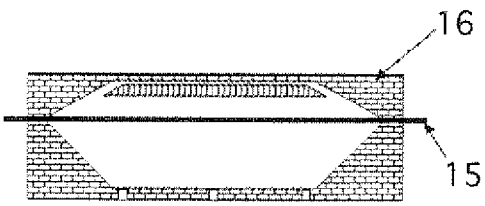
FIG. 4 is a view showing the condition in which a transparent conductive substrate according to the present invention is set to a vacuum molding machine.
Figure 5:
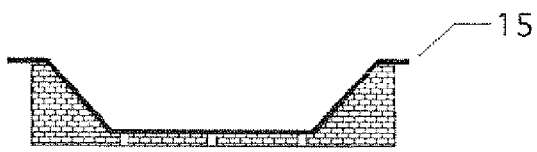
FIG. 5 is a view showing a transparent conductive substrate according to the present invention which is vacuum molded using a vacuum molding machine.
Figure 6:
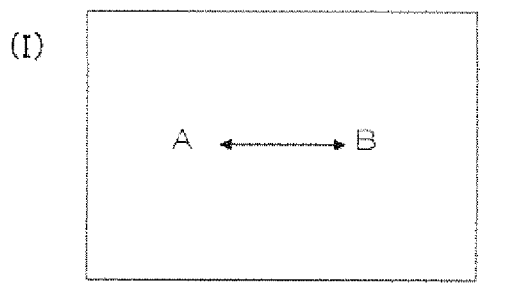
FIG. 6 is a view showing resistance-measuring points before and after a molding process according to the present invention.
Figure 6:
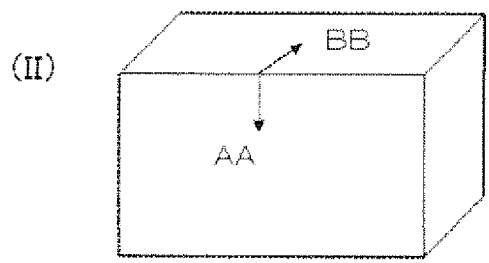

More specifically, the outline of the process for producing the transparent conductive substrate is explained by referring to FIG. 3. As shown in (A) of FIG. 3, according to the method described in any of Inventions 1 to 3, a coating solution for forming the transparent conductive film 11 having a network structure constituted from the metal fine particles is applied on the support 12 and then dried. Alternatively, the transparent conductive film 11 having a network structure constituted from the metal fine particles may be printed on the support 12 and then dried.

As the support 12, there may be used those formed of the above materials used in the production process described in any of Inventions 1 to 3. Among these materials, in view of the transferring step of Invention 9, a resin support is more preferably used. Examples of the preferred resins for the support include polyethylene terephthalate (PET), polyethylene naphthalate (PEN), polyimides (PI), etc.

The transparent conductive film 11 having a network structure constituted from the metal fine particles is formed on the support according to the above method. Next, in order to transfer the transparent conductive film 11 onto a desired thermoplastic resin substrate 14, the heat-sensitive adhesive layer or the like 13 is formed so as to cover the transparent conductive film 11 (FIG. 3 (B)).

As the heat-sensitive adhesive layer and the pressure-sensitive adhesive layer used in Invention 9, there may be used the above-mentioned heat-sensitive adhesive layer and pressure-sensitive adhesive layer.

In addition, the heat-sensitive adhesive layer or the like may also comprise various appropriate additives such as an ultraviolet absorber, a coloring pigment, an antistatic agent, an antioxidant and a silane coupling agent, if required.

As the method for forming the heat-sensitive adhesive layer or the like, there may be used the method in which after a material for the above heat-sensitive adhesive layer or the like is dissolved in an organic solvent or water, or dispersed in water, to prepare a coating agent having a well-controlled viscosity, the thus prepared coating agent is applied by a known coating method such as gravure coating and spin coating and then dried. The thickness of the heat-sensitive adhesive layer or the like is preferably 0.5 to 50 µm and more preferably 1 to 30 µm. When the thickness of the heat-sensitive adhesive layer or the like is less than 0.5 µm, adhesion between the heat-sensitive adhesive layer or the like and the thermoplastic resin substrate 14 tends to be undesirably lowered. Whereas, when the thickness of the heat-sensitive adhesive layer or the like is more than 50 µm, the resulting heat-sensitive adhesive layer or the like tends to be undesirably deteriorated in transparency.

The heat-sensitive adhesive layer or the like may be provided on one surface of the thermoplastic resin substrate in place of being provided on the support on which the transparent conductive film is formed.

As the method for transferring the transparent conductive film, there may be used the method of allowing the surface of the heat-sensitive adhesive layer or the like 13 formed on the transparent conductive film 11 of the transparent conductive transfer plate is laminated on the surface of thermoplastic resin substrate 14, to be opposite to the surface of the thermoplastic resin substrate 14, followed by bonding these surfaces to each other (FIG. 3 (C)). At this time, the resulting laminate may be subjected to heat treatment, pressure treatment, etc., if required.

As the thermoplastic resin substrate described in Invention 9, there may be used resin substrates formed of various thermoplastic resins. Among these resin substrates, there may be suitably used resin substrates selected from those substrates formed of acrylic resins, polycarbonates, polypropylene, polyvinyl chloride, amorphous polyethylene terephthalate, ABS and polystyrene, and laminated substrates thereof. The thickness of the thermoplastic resin substrate is not particularly limited, and is preferably 50 µm to 10 mm in the case where the substrate is subjected to molding process.

Next, the support 12 is released from the transfer plate to transfer the transparent conductive film 11 onto the substrate through the heat-sensitive adhesive layer or the like 13 by heating and/or application of pressure (FIG. 3 (D)).

The transparent conductive substrate using the organic resin substrate described in Invention 9 is readily subjected to molding process by a molding method such as a vacuum molding method, an air-pressure forming method and a press-molding method to thereby obtain the transparent conductive molded product according to Invention 13. Further, the transparent conductive substrate according to Invention 9 may also be attached onto a surface of a previously formed molded product, if required, through the heat-sensitive adhesive layer or the like. Furthermore, the transparent conductive molded product may also be produced by molding a laminate obtained by laminating the transparent conductive transfer plate and the thermoplastic resin substrate on each other, by the above molding method, and then releasing the support therefrom.

In addition, the transparent conductive molded product may also be produced by inserting the transparent conductive transfer plate into an injection molding machine such that the side of the heat-sensitive adhesive layer or the like formed on the transparent conductive transfer plate is located opposite to an inside of the injection molding machine, injecting a thermoplastic resin into a mold thereof to obtain a molded product, withdrawing the resulting molded product from the mold, and then releasing the support from the molded product. Further, the transparent conductive molded product may also be produced by inserting the transparent conductive substrate into an injection molding machine such that the side of the heat-sensitive adhesive layer or the like formed on the transparent conductive substrate is located opposite to is located at an inside of the injection molding machine, and then injecting a thermoplastic resin into a mold thereof to obtain a molded product.

EXAMPLES

Preparation of Silver Fine Particles 1

Forty grams of silver nitrate and 37.9 g of butyl amine were added to 200 mL of methanol, and the resultant mixture was stirred for 1 hr to prepare a solution A. Separately, 62.2 g of isoascorbic acid were weighed and added to 400 mL of water and dissolved therein while stirring, followed by adding 200 mL of methanol to the resulting solution, thereby preparing a solution B. While intimately stirring the solution B, the solution A was added dropwise thereto over 1 hr and 20 min. After completion of the dropping, the resulting reaction mixture was continuously stirred for 3 hr and 30 min. After completion of the stirring, the reaction mixture was allowed to stand for 30 min to precipitate solids. After removing a supernatant liquid by decantation, 500 mL of fresh water were added to the remaining reaction mixture, and the resulting liquid was stirred, allowed to stand and then subjected to decantation to remove a supernatant liquid therefrom. The above purification procedure was repeated three times. The precipitated solids were dried using a dryer at 40° C. to remove water therefrom. In addition, 20 g of the thus obtained silver particles and 0.2 g of "DISPER BYK-106" (produced by Byk Chemie Japan, Co., Ltd.) were added to a mixed solution of 100 mL of methanol and 5 mL of pure water, and mixed therewith for 1 hr. Thereafter, 100 mL of pure water were added to the resulting mixture to prepare a slurry. The resulting slurry was filtered and then dried using a dryer at 40° C. to obtain silver particles 1. As a result of observing the thus obtained silver particles by an electron microscope, it was confirmed that primary particles of the silver particles had an average particle diameter of 60 nm.

<Preparation of Dispersion Solution 1 of Metal Fine Particles>

The preparation procedure was carried out by referring to Japanese Patent Application Laid-Open (KOKAI) No. 2007-234299. That is, 6.1 g of a fluorine-containing solvent (mixture of HCFC-225ca and HCFC-225cb; "AK-225" (tradename) produced by Asahi Glass Co., Ltd.), 0.14 g of 1-butoxy-2-propanol, 0.75 g of toluene, 14.6 mg of "BYK-410" (produced by Byk Chemie Japan, Co., Ltd.) and 6.4 mg of sorbitan monooleate were mixed with each other. Next, 0.38 g of the silver particles 1 was added to the obtained mixture, followed by subjecting the resulting slurry to ultrasonic treatment using an ultrasonic dispersing device with an output of 100 W for 5 min. Then, 1.8 g of pure water were added to the slurry, and the obtained mixture was subjected to ultrasonic treatment using an ultrasonic dispersing device with an output of 100 W for 5 min, thereby preparing a dispersion solution 1 of metal fine particles.

<Preparation of Dispersion Solution 2 of Metal Fine Particles>

The preparation procedure was carried out by referring to Japanese PCT Application Laid-Open (TOKUHYO) No. 2005-530005. That is, 4 g of the silver particles 1, 30 g of toluene and 0.2 g of "BYK-410" (produced by Byk Chemie Japan, Co., Ltd.) were mixed with each other, and then the resulting mixture was subjected to dispersing treatment using an ultrasonic dispersing device with an output of 180 W for 1.5 min. Further, 15 g of pure water were added to the mixture, and then the resulting emulsion was subjected to dispersing treatment using an ultrasonic dispersing device with an output of 180 W for 30 sec, thereby preparing a dispersion solution 2 of metal fine particles.

<Preparation of Solution 1 of Precursor of Metal Fine Particles>

The preparation procedure was carried out by referring to Japanese Patent Application Laid-Open (KOKAI) No. 10-312715. That is, 25 g of pure water, 25 g of acetonitrile, 50 g of isopropanol-modified ethanol, 0.01 g of a flon-based anionic surfactant ("FC-93" produced by Sumitomo 3M Co., Ltd.) and 5 g of silver lactate were intimately mixed with each other, thereby preparing a solution 1 of a precursor of metal fine particles.

Example 1

The dispersion solution 1 of metal fine particles was applied onto a PET resin support whose surface properties were optimized by subjecting the support to corona treatment, using a spin coater, and then dried, thereby producing a transparent conductive transfer plate in which the metal fine particles were linked with each other on the support in a random network configuration (hereinafter referred to merely as a "transfer plate"). In addition, in order to enhance a conductivity of the conductive portions, the transfer plate was heat-treated in atmospheric air at 70° C. for 30 sec and further heat-treated in an atmosphere containing a formic acid vapor at 70° C. for 30 min, thereby producing the transfer plate used for production of a transparent conductive substrate. The transfer plate had a surface resistivity of 2Ω/□ and a transmittance of 80%. The surface resistivity was determined from an average value of three surface resistivity values measured on three points of a sample using "LORESTOR GP" (Model No. "MCP-T600") manufactured by Mitsubishi Chemical Corporation, whereas the transmittance was determined from an average value of three total transmittance values measured on three points of a sample using a haze meter "NDH2000" manufactured by Nippon Denshoku Kogyo Co., Ltd.

The transfer plate and a commercially available acrylic resin substrate coated with an acrylic resin heat-sensitive adhesive layer were thermocompression-bonded to each other using a hot press (110° C.; 20 kgf/cm$^2$) to transfer the transparent conductive film from the transfer plate to the substrate, and then the support was released from the transfer plate, thereby obtaining a transparent conductive substrate. The surface resistivity and transmittance of the thus obtained transparent conductive substrate were 2Ω/□ and 80%, respectively.

Example 2

The dispersion solution 2 of metal fine particles was applied onto a PET resin support whose surface was subjected to corona treatment, using a bar coater, and then dried, thereby producing a transfer plate in which the metal fine particles were linked with each other on the support in a random network configuration. In addition, in order to enhance a conductivity of the conductive portions, the transfer plate was immersed in each of acetone and a 1% hydrochloric acid aqueous solution for 5 min and then dried, and further heat-treated in atmospheric air at 150° C. for 30 sec, thereby producing the transfer plate used for production of a transparent conductive substrate. The transfer plate had a surface resistivity of 10Ω/□ and a transmittance of 86%.

The transfer plate and a polycarbonate resin substrate coated with an acrylic resin heat-sensitive adhesive layer were thermocompression-bonded to each other using a hot press (110° C.; 20 kgf/cm$^2$) to transfer the transparent conductive film from the transfer plate to the substrate, and then the support was released from the transfer plate, thereby obtaining a transparent conductive substrate. The surface resistivity and transmittance of the thus obtained transparent conductive substrate were 10Ω/□ and 86%, respectively.

Example 3

The solution 1 of a precursor of metal fine particles was applied onto a polyimide resin support whose surface was subjected to corona treatment, by spray coating, and then dried. Next, the resulting coating layer was irradiated with an ultraviolet ray to reduce and precipitate the metal fine particles, followed by washing the resulting product with water and then with acetone, thereby producing a transfer plate in which the metal fine particles were linked with each other on the support in a random network configuration. In addition, in order to enhance a conductivity of the conductive portions, the transfer plate was heat-treated in atmospheric air at 200° C. for 1 hr, thereby producing the transfer plate used for production of a transparent conductive substrate. The transfer plate had a surface resistivity of 40Ω/□.

The transfer plate and a commercially available polycarbonate resin substrate coated with an acrylic resin heat-sensitive adhesive layer were thermocompression-bonded to each other using a roll laminator (110° C.; 20 kgf/cm$^2$) to transfer the transparent conductive film from the transfer plate to the substrate, and then the support was released from the transfer plate, thereby obtaining a transparent conductive substrate. The surface resistivity and transmittance of the thus obtained transparent conductive substrate were 40Ω/□ and 75%, respectively.

Example 4

The same procedure as defined in Example 1 was conducted except for using a polyimide resin support, thereby producing a transfer plate. The thus obtained transfer plate had a surface resistivity of 2Ω/□ and a transmittance of 80%.

The transfer plate and a polypropylene resin substrate coated with an acrylic monomer heat-sensitive adhesive layer were thermocompression-bonded to each other using a roll laminator (110° C.; 20 kgf/cm$^2$) to transfer the transparent conductive film from the transfer plate to the substrate, and then the support was released from the transfer plate, thereby obtaining a transparent conductive substrate. The surface resistivity and transmittance of the thus obtained transparent conductive substrate were 2Ω/□ and 80%, respectively.

Example 5

The same procedure as defined in Example 2 was conducted to produce a transfer plate. The thus obtained transfer plate had a surface resistivity of 2Ω/□ and a transmittance of 80%.

A titanium-based coupling agent was applied onto a surface of a porous titanium oxide substrate to produce a coated titanium oxide substrate. The resulting coated titanium oxide substrate and the transfer plate were laminated together such that the titanium-based coupling agent was interposed therebetween. Next, the obtained laminate was heated at 100° C. for 30 min, and then the support was released therefrom, thereby obtaining a transparent conductive substrate. The surface resistivity of the thus obtained transparent conductive substrate was 2Ω/□.

Example 6

The same procedure as defined in Example 2 was conducted to produce a transfer plate. The thus obtained transfer plate had a surface resistivity of 10Ω/□ and a transmittance of 86%.

An ionic liquid (imidazolium-based) which was gelled by adding a gelling agent thereto was applied onto a surface of a porous titanium oxide substrate to produce a coated titanium oxide substrate. The resulting coated substrate and the transfer plate were laminated together. The obtained laminate was heated at 80° C. for 30 min, and then the support was released therefrom, thereby obtaining a transparent conductive substrate in which the ionic liquid was enclosed. The surface resistivity of the thus obtained transparent conductive substrate was 10Ω/□.

Example 7

The dispersion solution 2 of metal fine particles was applied onto a PET support whose surface was subjected to corona treatment, using a bar coater, and then dried, thereby producing a transfer plate in which the metal fine particles were linked with each other on the support in a random network configuration.

In addition, in order to enhance a conductivity of the conductive portions, the transfer plate was immersed in each of acetone and a 1% hydrochloric acid aqueous solution for 5 min and then dried, and further heat-treated in atmospheric air at 150° C. for 30 sec.

The following heat-sensitive adhesive layer coating solution 1 was applied onto the side of the transparent conductive film of the transfer plate such that the thickness of a dried coating film formed of the coating solution was 3 μm, and then dried at 100° C. for 5 min, thereby producing the transfer plate on which a heat-sensitive adhesive layer is laminated.

Further, the thus obtained transfer plate was laminated on a surface of a 1 mm-thick glass substrate such that the surface of the transfer plate where the heat-sensitive adhesive layer was provided was opposite to the glass substrate. The resulting laminate was thermally compressed at 180° C. using a hot laminator ("TAISEI FAST LAMINATOR VAII-700" manufactured by Taisei Laminator Co., Ltd.), and allowed to stand until the temperature thereof was dropped to room temperature, and then the support was released therefrom, thereby obtaining a transparent conductive substrate. The surface resistivity and transmittance of the thus obtained transparent conductive substrate were 10Ω/□ and 81%, respectively.

<Heat-Sensitive Adhesive Layer Coating Solution 1>

The heat-sensitive adhesive layer coating solution 1 was prepared by dissolving 15 g of a polyvinyl butyral resin ("S-LEC EL-2" produced by Sekisui Chemical Co., Ltd.) in 85 g of isopropanol.

Example 8

The transfer plate before being coated with the heat-sensitive adhesive layer was produced in the same manner as defined in Example 7 in order to produce a transparent conductive substrate. The following heat-sensitive adhesive layer coating solution 2 was applied onto the side of the transparent conductive film of the transfer plate such that the thickness of a coating film formed of the coating solution was 4 μm, thereby obtaining the transfer plate on which a heat-sensitive adhesive layer was laminated.

Further, the thus obtained transfer plate was laminated on a surface of a 1 mm-thick glass substrate such that the surface of the transfer plate where the heat-sensitive adhesive layer was formed was opposite to the glass substrate each other. The resulting laminate was compressed at room temperature using a laminator ("LAMIPACKER LPV6507" manufactured by Fujipla Inc.), and irradiated with an ultraviolet ray with an intensity of 200 mj/cm$^2$ using a high-pressure mercury lamp, and then the support was released therefrom, thereby obtaining a transparent conductive substrate. The surface resistivity and transmittance of the thus obtained transparent conductive substrate were 10Ω/□ and 80%, respectively.

<Heat-Sensitive Adhesive Layer Coating Solution 2>

The heat-sensitive adhesive layer coating solution 2 was prepared by mixing 50 g of urethane acrylate, 48 g of hydroxybutyl acrylate and 2 g of 1-hydroxycyclohexyl phenyl ketone while stirring.

Example 9

The same procedure as defined in Example 7 was conducted except that the following heat-sensitive adhesive layer coating solution 3 was used as the coating solution, thereby producing a transfer plate on which a heat-sensitive adhesive layer was laminated.

Further, the thus obtained transfer plate was laminated on a surface of a 125 μm-thick PET substrate such that the surface of the transfer plate where the heat-sensitive adhesive layer was formed was opposite to the PET substrate each other. The resulting laminate was thermally compressed at 180° C. using the above hot laminator and allowed to stand until the temperature thereof was dropped to room temperature, and then the support was released therefrom, thereby obtaining a transparent conductive substrate. The surface resistivity and transmittance of the thus obtained transparent conductive substrate were 10Ω/☐ and 81%, respectively.

<Heat-Sensitive Adhesive Layer Coating Solution 3>

The heat-sensitive adhesive layer coating solution 3 was prepared by dissolving 8.5 g of an acrylic resin ("DIANAL BR-83" produced by Mitsubishi Rayon Co., Ltd.) and 1.5 g of a polyester resin ("VYLON 200" produced by Toyobo Co., Ltd.) in a mixed solvent comprising 75 g of toluene and 15 g of methyl ethyl ketone.

Example 10

The same procedure as defined in Example 7 was conducted except that the heat-sensitive adhesive layer coating solution 3 was used as the coating solution, thereby producing a transfer plate on which a heat-sensitive adhesive layer was laminated.

Further, the thus obtained transfer plate was laminated on a surface of a 125 μm-thick polyethylene naphthalate resin substrate such that the surface of the transfer plate where the heat-sensitive adhesive layer was formed was opposite to the polyethylene naphthalate resin substrate each other. The resulting laminate was thermally compressed at 180° C. using the above hot laminator and allowed to stand until the temperature thereof was dropped to room temperature, and then the support was released therefrom, thereby obtaining a transparent conductive substrate. The surface resistivity and transmittance of the thus obtained transparent conductive substrate were 10Ω/☐ and 72%, respectively.

Example 11

The dispersion solution 2 of metal fine particles was applied onto a PET support whose surface was treated with a silicone releasing agent, using a bar coater, and then dried, thereby producing a transfer plate in which the metal fine particles were linked with each other on the support in a random network configuration.

In addition, in order to enhance a conductivity of the conductive portions, the transfer plate was immersed in each of acetone and a 1% hydrochloric acid aqueous solution for 5 min and then dried, and further heat-treated in atmospheric air at 150° C. for 30 sec.

The following pressure-sensitive adhesive layer coating solution 1 was applied onto the side of the transparent conductive film of the transfer plate such that the thickness of a dried coating film formed of the coating solution was 15 μm, and then dried at 100° C. for 5 min, thereby producing the transfer plate on which a pressure-sensitive adhesive layer was laminated.

Further, the thus obtained transfer plate was laminated on a surface of a 1 mm-thick glass substrate such that the surface of the transfer plate where the pressure-sensitive adhesive layer was formed was opposite to the glass substrate each other. The resulting laminate was compressed at room temperature using a laminator ("LAMIPACKER LPV6507" manufactured by Fujipla Inc.), and then the support was released therefrom, thereby obtaining a transparent conductive substrate. The surface resistivity and transmittance of the thus obtained transparent conductive substrate were 10Ω/☐ and 81%, respectively.

<Pressure-Sensitive Adhesive Layer Coating Solution 1>

The pressure-sensitive adhesive layer coating solution 1 was prepared by dissolving 30 g of a copolymer of butyl acrylate and hydroxybutyl acrylate and 1 g of an isocyanurate of tolylene diisocyanate in 69 g of ethyl acetate.

Comparative Example 1

The dispersion solution 1 of metal fine particles was applied onto a polycarbonate resin support using a spin coater, and then dried. However, a part of the support was dissolved in an organic solvent contained in the dispersion solution 1 of metal fine particles, so that the obtained conductive film failed to have a sufficient network structure. Successively, the thus coated support was immersed in an acetone bath. However, the conductive portions formed on the support were peeled off from the support, thereby failing to produce a transfer plate.

Comparative Example 2

The dispersion solution 2 of metal fine particles was applied onto an acrylic resin support using a bar coater, and then dried. Successively, the thus coated support was immersed in an acetone bath. However, a part of the support was dissolved, and the conductive portions formed thereon were peeled off from the support, thereby failing to produce a transfer plate.

Comparative Example 3

The dispersion solution 1 of metal fine particles was applied onto a porous titanium oxide support using a spin coater, and then dried. However, a part of the dispersion solution 1 of metal fine particles was penetrated into the porous support, so that the obtained film failed to form a sufficient conductive network structure.

The resulting coated support was heated at 200° C. for 1 hr, and then measured for its resistivity value. However, the resistivity value of the support was not measureable because the resistivity was too high.

<Method for Forming Transparent Conductive Film>

The dispersion solution 2 of metal fine particles was applied onto a 100 μm-thick PET support using a bar coater. Successively, the resulting coated support was naturally dried in atmospheric air to form a network structure of the silver fine particles owing to self-organizing phenomenon thereof. Next, the resulting product was heated at 150° C. for 2 min and then immersed in each of acetone and 1N hydrochloric acid, and thereafter heated and dried at 150° C. for 5 min to form a network structure comprising the silver fine particles.

Thus, the transparent conductive film having a network structure comprising the silver fine particles was formed on the support, thereby producing a transfer plate. The total transmittance as measured on a surface of the thus obtained transparent conductive film was 85%, and the surface resistivity of the transparent conductive film was 4.5Ω/□.

<Method for Preparing Heat-Sensitive Adhesive Layer Coating Solution 4>

The heat-sensitive adhesive layer coating solution 4 was prepared by dissolving 20 g of a vinyl chloride-vinyl acetate copolymer resin ("VAGH" produced by Union Carbide Corp.) in a mixed solvent comprising 40 g of toluene and 40 g of methyl ethyl ketone.

Example 12

The heat-sensitive adhesive layer coating solution 4 was used as the coating solution. The heat-sensitive adhesive layer coating solution 4 was applied onto the side of the transparent conductive film of the support obtained by the above method such that the thickness of a dried coating film formed of the coating solution was 3 μm, and dried at 100° C. for 5 min, thereby producing a transfer plate on which a heat-sensitive adhesive layer was laminated.

Next, the thus obtained transfer plate was laminated on a surface of a 300 μm-thick A-PET resin substrate such that the surface of the transfer plate where the heat-sensitive adhesive layer was formed was opposite to the A-PET resin substrate each other. The resulting laminate was thermally compressed at 180° C. using the above hot laminator and allowed to stand until the temperature thereof was dropped to room temperature, and then the support was released therefrom, thereby obtaining a transparent conductive substrate.

The transparent conductive substrate was subjected to vacuum molding using a vacuum molding machine to obtain a box-shaped transparent conductive molded product. The surface resistivity measured between the points A and B (A-B) of the transparent conductive substrate before molding was 4.6Ω/□, and the transmittance measured was 80%. Since the surface resistivity measured between the points AA and BB (AA-BB) of the molded product was 5.2Ω/□, it was confirmed that the molded product was free from such a phenomenon that the conductivity after molding was considerably deteriorated, even at bent portions of the molded product.

Example 13

The same procedure as defined in Example 12 was conducted except that the molded product was obtained by press molding in place of the vacuum molding, thereby producing a box-shaped transparent conductive molded product. The surface resistivity measured between the points A and B (A-B) of the transparent conductive substrate before molding was 4.6Ω/□, and the transmittance measured was 80%. Since the surface resistivity measured between the points AA and BB (AA-BB) of the molded product was 5.4Ω/□, it was confirmed that the molded product was free from such a phenomenon that the conductivity after molding was considerably deteriorated, even at bent portions of the molded product.

Example 14

The same procedure as defined in Example 12 was conducted except that a 300 μm-thick polycarbonate resin substrate was used in place of the A-PET resin substrate, thereby producing a box-shaped transparent conductive molded product. The surface resistivity measured between the points A and B (A-B) of the transparent conductive substrate before molding was 4.6Ω/□, and the transmittance measured was 81%. Since the surface resistivity measured between the points AA and BB (AA-BB) of the molded product was 5.4Ω/□, it was confirmed that the molded product was free from such a phenomenon that the conductivity after molding was considerably deteriorated, even at bent portions of the molded product.

Example 15

The same procedure as defined in Example 12 was conducted except that a 1 mm-thick ABS resin substrate was used in place of the A-PET resin substrate, thereby producing a box-shaped transparent conductive molded product. The surface resistivity measured between the points A and B (A-B) of the transparent conductive substrate before molding was 4.6Ω/□ and the transmittance measured was 78%. Since the surface resistivity measured between the points AA and BB (AA-BB) of the molded product was 5.3Ω/□, it was confirmed that the molded product was free from such a phenomenon that the conductivity after molding was considerably deteriorated, even at bent portions of the molded product.

Example 16

The same procedure as defined in Example 12 was conducted except that a 125 μm-thick acrylic resin substrate was used in place of the A-PET resin substrate, thereby producing a box-shaped transparent conductive molded product. The surface resistivity measured between the points A and B (A-B) of the transparent conductive substrate before molding was 4.6Ω/□, and the transmittance measured was 81%. Since the surface resistivity measured between the points AA and BB (AA-BB) of the molded product was 5.2Ω/□, it was confirmed that the molded product was free from such a phenomenon that the conductivity after molding was considerably deteriorated, even at bent portions of the molded product.

Comparative Example 4

A commercially available transparent conductive PET film (ITO film thickness: 140 nm; surface resistivity: 45Ω/□) was formed into a box-shaped molded product by using a press molding machine. Although the surface resistivity measured between the points A and B (A-B) of the film before molding was 32Ω/□, the surface resistivity measured between the points AA and BB (AA-BB) of the molded product was too high and therefore became unmeasurable. Thus, the conductivity of the molded product was considerably deteriorated.

Comparative Example 5

A commercially available transparent conductive PET film provided thereon with a mesh-like metal thin wiring was press-molded into a box-shaped molded product by using a press molding machine. Although the surface resistivity measured between the points A and B (A-B) of the film before molding was 0.1Ω/□, the surface resistivity measured between the points AA and BB (AA-BB) of the molded product was too high and therefore became unmeasurable. Thus, the conductivity of the molded product was considerably deteriorated. In addition, when observing a ridge portion of the molded product between the points AA and BB (AA-BB), it was confirmed that the metal thin wire was broken thereat.

INDUSTRIAL APPLICABILITY

The transparent conductive substrate of the present invention exhibits a low resistance, a high transmittance and an excellent anti-moire property. According to the process for producing a transparent conductive substrate according to the present invention, it is possible to readily produce the transparent conductive substrate without using any special apparatus, and further the process is applicable to production of various extensive substrates. Therefore, the transparent conductive substrate of the present invention can be suitably used as an electromagnetic shielding material, etc.

The transparent conductive substrate, the process for producing the transparent conductive substrate and the transparent conductive molded product according to the present invention are excellent in visibility and electromagnetic shielding property. Therefore, the molded product obtained by molding the transparent conductive substrate can be suitably used as an electromagnetic shielding material.

The invention claimed is:

1. A transparent conductive substrate produced by a process comprising the steps of:
   (1) locating a transparent conductive transfer plate and a substrate such that a transparent conductive film is formed on the transparent conductive transfer plate opposite to one surface of the substrate, wherein the transparent conductive film is embedded in either the substrate only, both the substrate and a heat-sensitive adhesive layer, both the substrate and a pressure-sensitive layer adhesive, both the substrate and a coupling agent layer or both the substrate and an organic gel layer, or not embedded in the substrate but embedded in any of the layers by itself such that the surface of the transparent conductive film is aligned with a surface of the substrate, the heat-sensitive adhesive layer, the pressure-sensitive adhesive layer, the coupling agent layer or the organic gel layer on the same plane, and wherein said transparent conductive transfer plate is produced by
   a process (a) comprising:
   applying a dispersion solution of metal fine particles capable of forming a self-organized film on a support having heat resistance and/or chemical resistance and then drying the obtained coating layer; and
   subjecting the resulting dried material to heat treatment and/or chemical treatment to form a transparent conductive film exhibiting a low resistance, a high transmittance and an excellent anti-moire property and having a conductive random network structure on the support; or
   a process (b) comprising:
   applying a solution of a metal salt as a precursor of metal fine particles capable of forming a self-organized film on a support having a heat resistance and/or a chemical resistance and then drying the obtained coating layer; and
   reducing and precipitating the precursor of the metal fine particles by heating, irradiation with an ultraviolet ray or a reducing gas to form a transparent conductive film exhibiting a low resistance, a high transmittance and an excellent anti-moire property and having a conductive random network structure on the support;
   (2) subjecting the transparent conductive transfer plate and the substrate to compression-bonding or thermocompression-bonding to each other to transfer the transparent conductive film onto the substrate; and
   (3) releasing the support from the transparent conductive transfer plate.

2. A transparent conductive substrate according to claim 1, wherein the substrate is a thermoplastic resin substrate.

3. A transparent conductive substrate according to claim 2, wherein the metal fine particles are formed of at least one metal element selected from the group consisting of Au, Ag, Cu, Ni, Co, Fe, Cr, Zn, Al, Sn, Pd, Ti, Ta, W, Mo, In, Pt and Ru, or an alloy comprising at least two of the metal elements.

4. A transparent conductive substrate according to claim 2, wherein the heat-sensitive adhesive layer or the pressure-sensitive adhesive layer is a layer of a heat-sensitive adhesive or a pressure-sensitive adhesive which is formed of a thermoplastic resin.

5. A transparent conductive substrate according to claim 2, wherein the thermoplastic resin substrate is a resin substrate selected from the group consisting of an acrylic substrate, a polycarbonate substrate, a polypropylene substrate, a polyvinyl chloride substrate, an amorphous polyethylene terephthalate substrate, an ABS substrate, a polystyrene substrate and a laminated substrate of any two or more of these substrates.

6. A transparent conductive molded product produced by molding the transparent conductive substrate as defined in claim 2.

7. A transparent conductive substrate according to claim 1, wherein prior to applying the dispersion solution of the metal fine particles or the solution of the metal salt on the support, the support is subjected to surface treatment.

8. A transparent conductive substrate produced by a process comprising the steps of:
   (1) forming a heat-sensitive adhesive layer, a pressure-sensitive adhesive layer, a coupling agent layer or an organic gel layer on at least one of the surface of a transparent conductive transfer plate on which a transparent conductive film is formed, and one surface of a substrate, wherein the transparent conductive film is embedded in either the substrate only, both the substrate and the heat-sensitive adhesive layer, both the substrate and the pressure-sensitive adhesive layer, both the substrate and the coupling agent layer or both the substrate and the organic gel layer, or not embedded in the substrate but embedded in any of the layers by itself such that the surface of the transparent conductive film is aligned with a surface of the substrate, the heat-sensitive adhesive layer, the pressure-sensitive adhesive layer, the coupling agent layer or the organic gel layer on the same plane, and wherein said transparent conductive transfer plate is produced by
   a process (a) comprising:
   applying a dispersion solution of metal fine particles capable of forming a self-organized film on a support having heat resistance and/or chemical resistance and then drying the obtained coating layer, and
   subjecting the resulting dried material to heat treatment and/or chemical treatment to form a transparent conductive film exhibiting a low resistance, a high transmittance and an excellent anti-moire property and having a conductive random network structure on the support; or
   a process (b) comprising:
   applying a solution of a metal salt as a precursor of metal fine particles capable of forming a self-organized film on a support having a heat resistance and/or a chemical resistance and then drying the obtained coating layer; and reducing and precipitating the precursor of the metal fine particles by heating, irradiation with an ultraviolet ray or a reducing gas to form a transparent conductive film exhibiting a low resistance, a high transmittance and an excellent anti-moire property and having a conductive random network structure on the support;

(2) subjecting the transparent conductive transfer plate and the substrate to compression-bonding or thermocompression-bonding to each other to transfer the transparent conductive film onto the substrate; and (3) releasing the support from the transparent conductive transfer plate.

9. A transparent conductive substrate according to claim 8, wherein the substrate is a thermoplastic resin substrate.

10. A transparent conductive substrate according to claim 9, wherein the metal fine particles are formed of at least one metal element selected from the group consisting of Au, Ag, Cu, Ni, Co, Fe, Cr, Zn, Al, Sn, Pd, Ti, Ta, W, Mo, In, Pt and Ru, or an alloy comprising at least two of the metal elements.

11. A transparent conductive substrate according to claim 9, wherein the heat-sensitive adhesive layer or the pressure-sensitive adhesive layer is a layer of a heat-sensitive adhesive or a pressure-sensitive adhesive which is formed of a thermoplastic resin.

12. A transparent conductive substrate according to claim 9, wherein the thermoplastic resin substrate is a resin substrate selected from the group consisting of an acrylic substrate, a polycarbonate substrate, a polypropylene substrate, a polyvinyl chloride substrate, an amorphous polyethylene terephthalate substrate, an ABS substrate, a polystyrene substrate and a laminated substrate of any two or more of these substrates.

13. A transparent conductive molded product produced by molding the transparent conductive substrate as defined in claim 9.

14. A transparent conductive substrate according to claim 8, wherein prior to applying the dispersion solution of the metal fine particles or the solution of the metal salt on the support, the support is subjected to surface treatment.

* * * * *